(12) United States Patent
McGinnis et al.

(10) Patent No.: US 7,038,474 B2
(45) Date of Patent: May 2, 2006

(54) LASER-INDUCED CRITICAL PARAMETER ANALYSIS OF CMOS DEVICES

(75) Inventors: Patrick J. McGinnis, Poughkeepsie, NY (US); John D. Sylvestri, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,556

(22) Filed: Sep. 24, 2004

(65) Prior Publication Data

US 2006/0066325 A1 Mar. 30, 2006

(51) Int. Cl.
*G01R 31/302* (2006.01)
*G06K 9/00* (2006.01)

(52) U.S. Cl. ............... 324/752; 324/750; 324/751; 382/145

(58) Field of Classification Search ........... 324/765, 324/158.1, 751, 752, 753; 250/310, 492.2, 250/311; 356/237.2, 237.5
See application file for complete search history.

(56) References Cited

U.S. PATENT DOCUMENTS

| | | | |
|---|---|---|---|
| 3,295,105 A * | 12/1966 | Gray et al. | 382/292 |
| 4,564,801 A | 1/1986 | Kirby | |
| 5,298,797 A | 3/1994 | Redl | |
| 5,430,305 A | 7/1995 | Cole, Jr. et al. | |
| 5,952,837 A | 9/1999 | Koyama | |
| 6,078,183 A | 6/2000 | Cole, Jr. | |
| 6,462,814 B1 * | 10/2002 | Lo | 356/237.2 |
| 6,566,897 B1 * | 5/2003 | Lo et al. | 324/751 |
| 6,580,281 B1 | 6/2003 | Falk | |
| 6,727,593 B1 | 4/2004 | Toyoda et al. | |
| 2005/0006602 A1 * | 1/2005 | Perdu et al. | 250/492.22 |

* cited by examiner

*Primary Examiner*—Jermela Hollington
*Assistant Examiner*—Jimmy Nguyen
(74) *Attorney, Agent, or Firm*—Lisa U. Jaklitsch

(57) ABSTRACT

A technique is described for performing critical parameter analysis (CPA) of a semiconductor device (DUT) by combining the capabilities of conventional automated test equipment (ATE) with a focused optical beam scanning device such as a laser scanning microscope (LSM). The DUT is provided with a fixture such that it can be simultaneously scanned by the LSM or a similar device and exercised by the ATE. The ATE is used to determine pass/fail boundaries of operation of the DUT. Repeatable pass/fail limits (for timing, levels, etc.) are determined utilizing standard test patterns and methodologies. The ATE vector pattern(s) can then be programmed to "loop" the test under a known passing or failing state. When light energy from the LSM scanning beam sufficiently disturbs the DUT to produce a transition (i.e., to push the device outside of its critical parameter limits), this transition is indicated on the displayed image of the DUT, indicating to the user which elements of the DUT were implicated in the transition.

20 Claims, 2 Drawing Sheets

LASER-INDUCED CRITICAL PARAMETER ANALYSIS OF CMOS DEVICES

BACKGROUND OF INVENTION

The present invention relates to semiconductor device testing, and more particularly to detecting failures and failure mechanisms in semiconductor integrated circuitry, especially CMOS (Complementary Metal-Oxide-Semiconductor) integrated circuitry.

As semiconductor devices (e.g., CMOS integrated circuits) become increasingly complex, it becomes increasingly difficult, and increasingly important, to identify elements of those devices that affect common failure modes and "critical parameters" of the device. Typically, critical parameters are "spec sheet" performance limits that dictate whether a completed device meets or fails to meet its target specifications. Examples of such limits are critical setup times, hold times, min/max propagation delays, etc. Other examples include min/max voltage levels at a given drive current, min/max slew rates or rise/fall times (usually determined by comparing a voltage against predetermined threshold levels before and after a predetermined time interval), etc.

A variety of techniques employing laser scanning have been used to induce and detect anomalies in complex semiconductor devices via thermal stimulation or photon bombardment. It is well known to those of ordinary skill in the art that thermal stimulation and/or photon bombardment can be used to affect the behavior of semiconductor devices. For example, U.S. Pat. No. 5,430,305, "Light-induced Voltage Alteration for Integrated Circuit Analysis", issued Jul. 4, 1995 to Cole, Jr. et al. (hereinafter "Cole '305") describes a prior-art technique whereby LIVA (Light Induced Voltage Alteration) is employed to sense voltage changes across a semiconductor device driven by a constant current source. These voltage changes occur in response to a focused, scanning light source (e.g., a laser scanning microscope (LSM)). In one embodiment of Cole '305, the voltage changes are used to produce a light dark image that is synchronized with and overlaid upon an "visual" image of the device under test (DUT) to produce a visual on-screen indication of the state of the sensed voltage changed at the time when the scanning beam passed over the corresponding location on the DUT.

Another example of a prior-art technique is given in U.S. Pat. No. 6,078,183, "Thermally-induced Voltage Alteration for Integrated Circuit Analysis", issued Jun. 20, 2000 to Cole, Jr. (hereinafter "Cole '183") describing a technique whereby a laser microscope (or similar device) is used to scan a semiconductor device. The scanning beam produces localized heating of conductors (e.g., patterned metallization) of the semiconductor device. This localized heating produces a thermoelectric potential due to the Seebeck effect in and conductors with open-circuit defects and induces a resistance change in any conductors with short-circuit defects. In either case, this produces a voltage change across the semiconductor device when powered by a constant current supply. The voltage across the semiconductor device is converted to a light/dark signal and overlaid on a displayed image of the semiconductor device (in similar fashion to that described herein above with respect to Cole '305) to indicate the state of the sensed voltage across the semiconductor as a function of the position of the scanning beam's position. The technique employed by Cole '305 is commonly referred to as TIVA (Thermally Induced Voltage Alteration).

Still another example of a prior art technique is given by U.S. Pat. No. 5,952,837, "Scanning Photoinduced Current Analyzer Capable of Detecting Photoinduced Current in Nonbiased Specimen", issued Sep. 14, 1999 to Koyama (hereinafter "Koyama"). Similar to Cole '183, Koyama uses a laser-scanning microscope (LSM) to image and thermally stimulate conductors of a semiconductor device. Unlike Cole '183, however, Koyama senses only currents produced by thermoelectromotive force produced by the Seebeck effect in response to localized heating of conductors of a semiconductor device. The Koyama technique is intended primarily to locate voids underlying conductors of an integrated circuit, the theory being that conductors overlying voids will rise in temperature to greater degree than conductors overlying solid material, thereby producing a resistance increase corresponding to the rise in temperature. A current amplifier is used to detect Seebeck effect currents produced during scanning. The detected current is converted to a light/dark signal and overlaid upon a displayed image of the semiconductor device to produce a visual indication of the location of buried voids and other similar defects in the semiconductor device. This technique is often referred to as "OBIRCH" (Optical Beam Induced Resistance Change).

Cole '305, Cole '183 and Koyama all operate on either a statically biased or unbiased DUT (Device Under Test). The interaction of the scanning beam (e.g., LSM) induces either a voltage or current change that is sensed, amplified, and finally overlaid with a Laser Scanning Microscope(s) confocal or reflected light image. In each case, the response of the device under test is recorded versus scanner position to produce an image. Nominally, the recording and display techniques of Cole '305, Cole '183 and Koyama require an analog to digital (A/D) conversion, a general-purpose computer and a monitor.

These techniques and other similar techniques are used to detect defect excursions, diagnose their root sources, and to aid an operator in determining appropriate corrective action. Such techniques can be collectively referred to as physical failure analysis, or PFA. Traditionally, PFA is performed on semiconductor devices at a dedicated PFA laboratory away from the semiconductor device's point of fabrication (the semiconductor "fab"). Typically, PFA laboratories are equipped with a wide variety of complex analytical equipment for diagnosing semiconductor device problems. When a defect excursion cannot be resolved by standard in-fab (i.e., at the point of fabrication) inspection and review procedures, samples of the defective product wafers are taken from the fab to the PFA laboratory, where they are extensively tested (and typically never returned). This process introduces costly delays into the analysis cycle and requires the sacrifice of an entire wafer to characterize defects, whose root cause usually involves only a few small, isolated elements of a single semiconductor device on the wafer.

Cole '305, Cole '183, Koyama and other similar PFA techniques generally assume the practicality of biasing a semiconductor device (DUT) with a constant voltage or current source in a manner such that the DUT can be configured or exercised to put it into a known or measurable failing state. For slow timing and low static power devices this is often feasible. However, when high power and/or high frequency excitation are necessary, these techniques become inefficient at best, and in most cases inapplicable.

These prior-art PFA techniques (e.g., COLE305, COLE183, KOYAMA) tend to be good at detecting and isolating "hard" static failures such as "Shorts: (Low electrical Resistance) or "Opens: (High Electrical Resistance) in devices but tend not to be useful for detecting and isolating "AC" type critical parameter failure mechanisms (e.g., timing sensitive failures, defects that cause only Vmin or Vmax failures, timing or voltage condition sensitive failures, etc.).

SUMMARY OF INVENTION

The present invention provides a technique for performing critical parameter analysis (CPA) of a semiconductor device (DUT—device under test) by combining the capabilities of conventional automated test equipment (ATE) with a focused optical beam scanning device such as a laser scanning microscope (LSM). The DUT is provided with a fixture designed to connect it to the ATE while the DUT is situated within the scanning area (i.e., in the scanning chamber) of the LSM. The LSM (or similar device) scans and images the semiconductor device (DUT) while the ATE exercises the DUT according to a set of test vectors. The ATE also monitors responses of the DUT to the ATE's stimulus and compares them against a set of predefined expect responses contained in the test vectors. If a "transition" is detected between the predefined expected responses and actual response from the DUT, the ATE generates an output signal at the time the "transition" is detected, preferably in the form of a short pulse signal. In the present context a "transition" refers to a change of state of a test comparison signal from the ATE whereby the ATE indicates the current state of match/mismatch between expected responses and actual responses from the DUT. The ATE is configured to iteratively loop through the predefined stimuli. The predefined stimuli and responses are configured to operate the DUT close to its critical parameter limits (i.e., close to the point at which a response or "pass/fail" boundary would be detected by the ATE, but still producing response matches or known results). Typically, the predefined stimuli and expected responses thereto are provided to the ATE in the form of a set of test vectors.

While the ATE is exercising and monitoring the DUT, the LSM's scanning beam is traversing the DUT, applying light energy to the DUT wherever it scans. This light energy "disturbs" circuitry of the DUT wherever it strikes. Whenever a "disturbance" is significant enough to produce a change in the responses from the DUT that causes a mismatch between the DUT's responses and the predefined expected responses, the ATE flags a "transition" condition by generating its output signal indication. The output signal indication is then merged with an image (on a suitable display device) of the DUT being produced by the LSM to produce a visible "spot" on the image which appears on the image at the place on the DUT illuminated by the scanning beam at the time the failure occurred. Because of this "synchronization" between the scanning beam, the DUT image and the ATE failure indication, the ATE-generated "spot" indicates the physical location on the DUT of elements involved in the failure.

According to an aspect of the invention, the ATE can be configured to "short-cycle" the test up to the point of failure detection, when a failure is detected. This effectively improves the test's visual "resolution". "Short-cycling" involves resetting the test back to its starting point whenever a failure is detected. In the present context, a "failure" is a difference between actual responses from the DUT received by the ATE and the predefined expected responses. By resetting the test back to its starting point when a failure is detected, test stimuli (vectors) past the point of failure are not executed, thereby shortening the test cycle and increasing the frequency with which the failure occurs.

BRIEF DESCRIPTION OF DRAWINGS

These and further features of the present invention will be apparent with reference to the following description and drawings, wherein.

DETAILED DESCRIPTION

The present inventive technique provides Critical Parameter Analysis of complex semiconductor devices by combining the capabilities of automated test equipment (ATE) and optical beam microscopes (e.g., Laser Scanning Microscope or LSM). The ATE provides stimulus for the semiconductor device (a Device Under Test or DUT, e.g., a complex CMOS integrated circuit), while the Laser Scanning Microscope (or similar device) scans the semiconductor device, simultaneously producing a viewable image thereof and imparting photonic (light) energy to selected elements thereof as the scanning beam passes thereover. Whenever the ATE detects a device failure (i.e., when the DUT fails to generate an expected response to ATE stimulus) the ATE generates an output pulse. This output pulse is provided as an input to the LSM video display system in much the same manner described hereinabove with respect to Cole '305, Cole '183 and Koyama to produce a visible spot overlaying the viewable image that indicates the position of the scanning beam at the time the "transition" was detected.

By configuring the ATE with vectors designed to operate the DUT close to one or more of its "critical parameter" limits, disturbances caused by energy from the scanning beam passing over selected active and/or passive elements can cause the DUT's behavior to change such that the ATE detects a device "transition". By viewing the location of the failure "spot" on the viewable image, a user can readily determine, in real-time, which devices (when disturbed by the scanning beam) cause critical parameter transitions.

Typically, ATE is capable of detecting signal transitions and threshold voltage levels. This is accomplished with test vectors that provide pre-defined stimulus to the DUT and define what outputs are expected at what time. For example, if a critical signal edge is supposed to occur within 12 ns of a given clock edge, the ATE test vector set generates the clock edge, then instructs the ATE to determine, after 12 ns, whether the edge has occurred. If not, the ATE declares a failure. Similar tests are readily defined for confirming logic signal level or transitions within specific time limits, minimum/maximum voltage levels, etc.

In one embodiment of the invention, when a failure is detected by the ATE, it "short cycles" its test, repeatedly running the test from its starting point up to the point of failure and recycling back to the start of the test.

Figure 1:
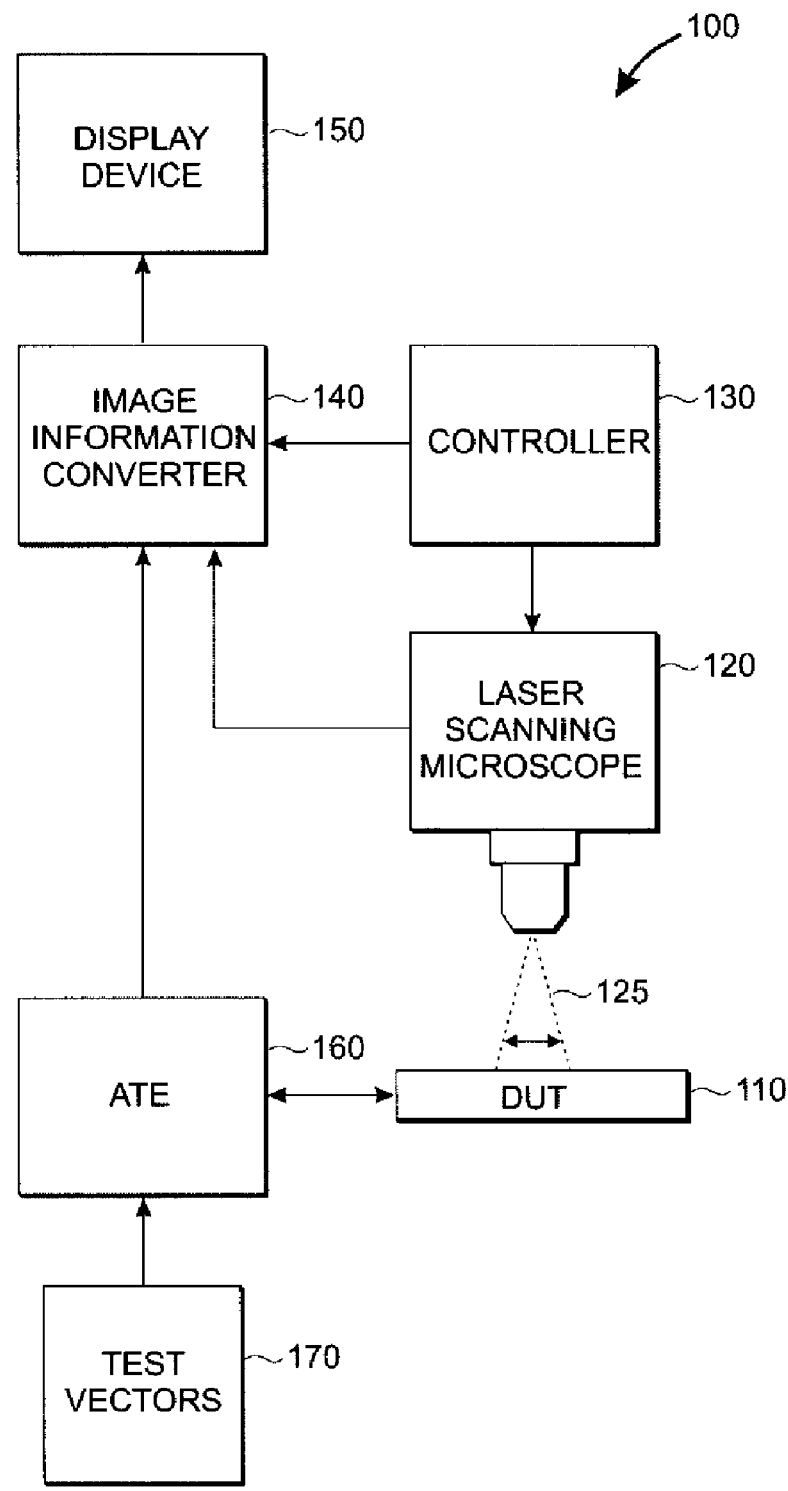
FIG. 1 is a block diagram of a system for Critical Parameter Analysis (CPA) of semiconductor devices, in accordance with the invention.

FIG. 1 is a block diagram of a system 100 for providing Critical Parameter Analysis of semiconductor devices, according to the present invention. A DUT (Device Under Test, i.e., a semiconductor device, typically one die of interest on a semiconductor wafer), is provided. The device (e.g., die) is placed within the scanning path 125 of a LSM 120 or similar instrument. In addition, the device is connected to an ATE 160 by any suitable fixture such that the ATE can provide stimulus signals to the DUT and receive signal responses therefrom. The ATE operates according to a set of test vectors 170 for the purpose of exercising the DUT very close to its specified limits (i.e., close to its critical parameter limits). The LSM 120 operates under the supervision of a controller 130 that defines the scanning rate, beam power, spot size (if applicable), etc. The controller 130 synchronizes an image information converter 140 with the scanning operation of the LSM 120 such that an optical signal (either confocal or reflected) therefrom is operated upon by the image information converter 140 to produce a coherent, viewable image of the DUT 110 on a display device 150. An output signal from the ATE 160 is merged with and overlaid upon the viewable image by the image information converter 140 with the net effect being for any given point on the viewable image of the DUT 110, the overlaid image represents the state of the ATE output signal at the time the scanning beam of the LSM 120 passed over the corresponding point on the DUT 110.

The ATE 160 must be capable of "looping" sequences of test vectors, and capable of generating an output signal synchronous with the detection of a failure. That is, it is not sufficient to declare that a failure has occurred at the completion of a test sequence. It is necessary that the ATE 160 be capable of indicating a failure at the moment a device failure is detected. Those of ordinary skill in the art will immediately understand that this can be accomplished in a variety of ways. One suitable way is to utilize the ATE's "break on state" capability to break out of normal test loop whenever a predetermined state occurs. In this case, the "state" would be a vector compare error whereby a response from the DUT does not match the expected response defined by the test vectors. At the point when a vector compare error occurs, the ATE generates an output signal and recycles the test back to its start.

Those skilled in the art will appreciate that other techniques can be employed to achieve similar results from suitably equipped ATE, up to and including customization of the ATE to provide the desired output signal and behavior.

A Hewlett Packard 82000 semiconductor testing system (ATE) has a sequencer with pin driver electronics that support the "Break on state" mode of operation. The number of control vectors contained in a vector looped pattern is determined by several factors. The number of vector cycles is typically bounded on the low end by a modulo function (i.e., the minimum number of vectors is the nearest multiple of some modulus greater than or equal to the desired number of vectors). The maximum number of vector cycles is usually limited by the tester's vector memory size. Test vectors can be either manually generated, or preferably, generated by translation and editing of manufacturing test pattern(s).

When a semiconductor device has been identified for CPA (Critical Parameter Analysis), it is moved to the CPA tester of the present invention. Typically this device (ultimately, the DUT in the CPA tester) is identified during a final wafer testing stage. Once a device for test has been identified and the critical parameters of interest have been identified, the corresponding test pattern(s) of interest (from "production" wafer testing equipment) can be ported/translated into test vectors for use by the CPA of the present invention. This helps to ensure a strong correlation between the behavior observed on the production test equipment and the behavior that can be expected from the CPA test equipment of the present invention. From ATE testing it is then determined (e.g., via "shmoo" plot outputs or other suitable means) where the pass/fail boundary of DUT operation for the critical parameter(s) of interest should be placed. The test vectors pattern are edited as necessary to define the appropriate pass/fail conditions. These vectors can then be used in their entirety; or a selected subset can be employed to probe only specific critical parameters of interest for the DUT. Assuming the use of the HP 82000 tester, any unused tester pin can be configured as an output pin to provide the aforementioned failure output pulse (signal). This programmed output pin is set (using the "break on state" capability) to generate a short pulse whenever a device "transition" occurs. The output signal generated by this pin is used as a video output from the ATE to the LSM image information converter, where it is merged with the scan signal from the LSM. Typically the pin is configured so that its output level is compatible with a suitable LSM video input, and can be a pulse of long or short duration. The pulse duration is limited by the ATE's vector execution rate and minimum tester edge interval specifications. Once configured, the ATE is operated in a "loop" mode whereby it repeatedly executes the test vectors provided to it.

Figure 2:
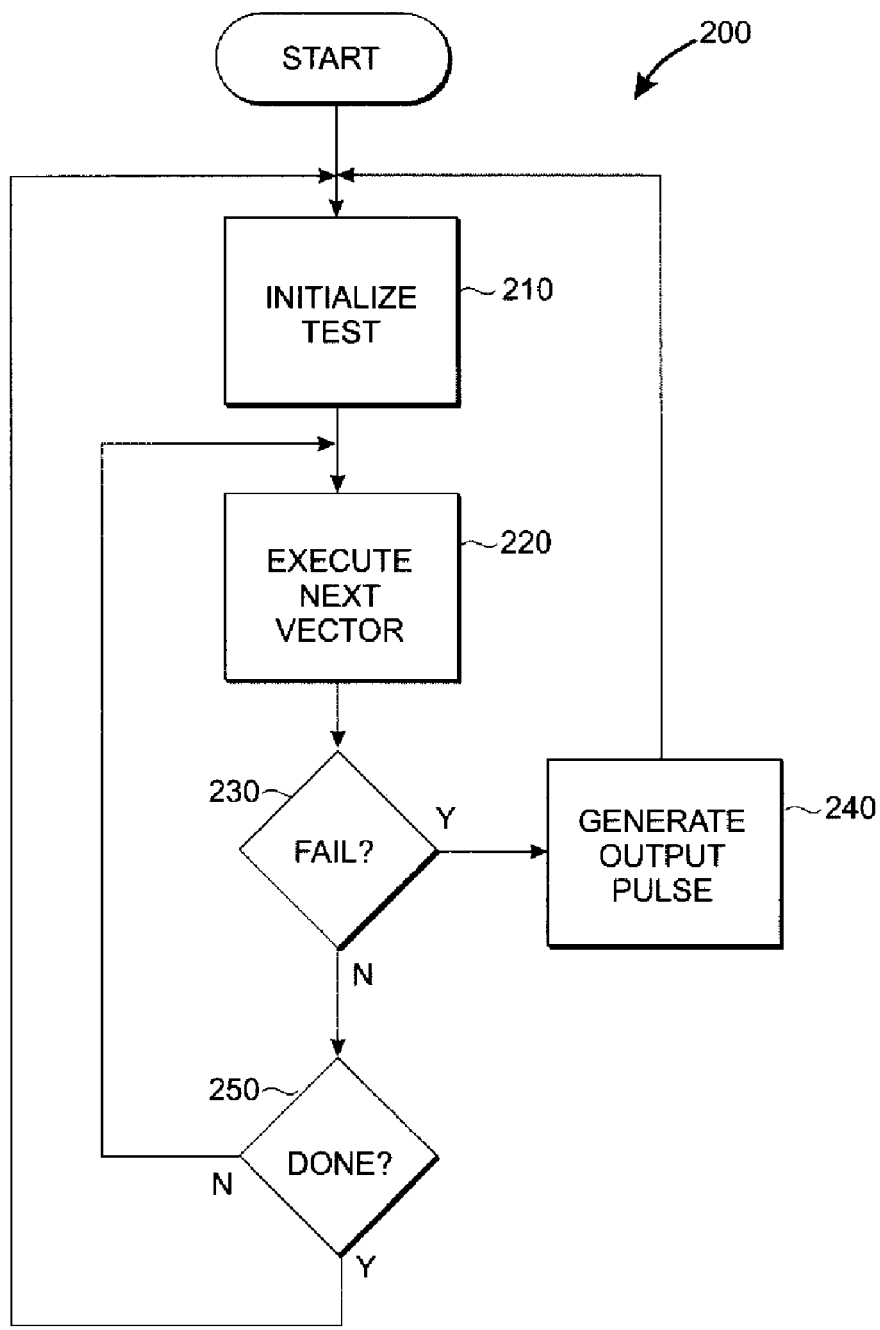
FIG. 2 is a flow diagram showing an ATE sequence for CPA testing of semiconductor devices, in accordance with the invention.

FIG. 2 is a flow diagram 200 showing a typical sequence of test operations for the ATE (e.g., 160, FIG. 1). In a first step 210, the test is initialized. Typically, this involves pointing the ATE's execution to the first vector, setting up the vector execution rate and other relevant testing parameters, and starting the ATE's test cycle. In a next step 220, the ATE executes a test vector, producing stimulus to the DUT and comparing responses expected from the DUT to responses defined in the test vector. In a next step 230, the ATE determines whether there was a vector comparison error (device failure) resulting from the test vector just executed. If not, a next step 250 determines whether the last vector has been processed. If not, then the test sequence continues by executing the next test vector in sequence at step 220. If the last test vector has been processed, then the test sequence returns to the beginning (at step 210) to start the test over again. At the step 230, if it is determined that there has been a vector comparison failure (device failure), then the test sequence generates an output pulse in a next step 240, then "short cycles" the test by returning to the initialization step 210 to re-start the test sequence.

Those of ordinary skill in the art will immediately understand that there are many variations and adaptations that are possible to the flow diagram of FIG. 2 that would produce similar or suitably equivalent behavior of the ATE for the purposes of the present inventive technique. It is fully within the spirit and scope of the present invention to do so.

For failure isolation via CPA, it is generally best to loop on "tight" or short vector sequences as this minimizes the loop time. Loop time has an impact on the visual "resolution" of the test, as is described in greater detail hereinbelow. Running the tester period at minimum (fastest speed) with the least number of vectors in the test sequence loop provides the best test "resolution".

During ATE operation as described hereinabove, the DUT during the test loop is fixtured to reside inside the scanning chamber of a LSM (Laser Scanning Microscope) or similar optical scanning device. Either "backside isolation" (using a thinned and polished module), or top down isolation (utilizing a cantilever probe card) can be employed. The DUT, thus fixtured, is then exercised by the ATE as described hereinabove. The LSM is focused on the surface of the DUT (e.g., in confocal mode). Once focus is established, the configured ATE output signal is connected to a suitable LSM video input for merging with the LSM's video image signal. As the LSM's laser is scanned across the DUT surface, (and while the ATE's vector sequence is iterated) any gate level device that is "disturbed" sufficiently by the laser to cause a vector comparison failure will cause a "spot" to appear on the live confocal image at the location of that gate level device in the image. This image can then be used by itself or overlaid with any reflected light image.

Because the LSM and the ATE are operated asynchronously with respect to each other, the effective visual resolution of any test failure "spot" is heavily dependent upon both ATE test setting and LSM scanning settings. The faster the ATE executes its tests relative to the scanning rate of the LSM, the more accurate the timing of the "failure pulse" (ATE output signal) produced by the ATE with respect to the LSM image. LSM settings can also have a big effect on effective "spot size". Scan speed, scan direction, scanning laser frequency and any other setting which can ultimately affect spot size can be adjusted to resolve the "spot" to any desired level. This resolution issue is essentially the same as for any of the other prior-art LSM techniques described hereinabove (LIVA, TIVA, OBIRCH).

The detection of critical parameter failures using the present inventive CPA technique is essentially digital in nature. There is no latent dependency associated with obtaining meaningful signatures as in LIVA, TIVA or OBIRCH. The conventional techniques often provide signatures at many different bias levels. These signatures can either be compared to signatures produced by a known good device or can be "manually" analyzed. In either case, the conventional techniques leave much interpretation up to the user.

The CPA signatures produced by the present inventive technique, on the other hand, are either present or not present; and are readily explained by identifying the ATE test vector that produced the failure signal on the display. (Those skilled in the art will immediately understand that this is within the basic built-in capabilities of the ATE.) Accordingly, there is very little left to the user to interpret. A CPA measurement simply identifies those circuits which when stimulated by a laser, cause critical parameters to fall outside of predetermined limits. Once identified by CPA (using the present inventive technique), "transitions" can be further explored and characterized by PFA or any other suitable other EFA (Electronic Failure Analysis) technique.

One significant advantage of the present inventive technique is that it is easily implemented at the point of wafer manufacture. Laser scanning microscopes (LSMs) and ATE similar to the HP82000 are not uncommon items at semiconductor fabrication facilities, and the present inventive technique is not difficult to implement with such equipment. This means that significant failure analysis (in the form of CPA), previously relegated to off-site PFA laboratories, can now be performed at the point of manufacture, non-destructively. Further, when employing the present inventive technique, it is not necessary to sacrifice the entire wafer on which the DUT resides.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A system for critical parameter analysis (CPA) of a semiconductor device (DUT), comprising:
    a laser scanning microscope (LSM);
    automated test apparatus (ATE) for providing predefined stimulus to the semiconductor device (DUT), for comparing responses from the semiconductor device (DUT) against a set of predefined expected responses, and for generating a short output pulse when a difference is detected between responses from said semiconductor device (DUT) and said predefined expected responses, said automated test apparatus being connected to the DUT while the DUT is disposed within a scanning chamber of said laser scanning microscope (LSM);
    display means for displaying an image of said semiconductor device produced by said laser scanning microscope (LSM);
    means for overlaying a visible representation of said short output pulse on said displayed image to indicate a corresponding position on the semiconductor device (DUT) of a scanning beam of the laser scanning microscope (LSM) at the time the output pulse was generated; and
    means for simultaneously scanning said semiconductor device (DUT) with said laser scanning microscope (LSM) while said ATE repeatedly applies said predefined stimulus to said DUT and compares responses therefrom against said predefined expected responses;
    wherein
        the automated test apparatus (ATE) and the semiconductor device (DUT) form a closed loop feedback system;
        the automated test apparatus (ATE) is programmed to 'break' in or out of a vector loop which is detecting pass/fail operation of the semiconductor device (DUT); and
        said automated test apparatus (ATE) is configured to repeatedly cycle ("short-cycle") said predefined stimulus from a starting point up to a point of failure when such failure is detected.

2. A system according to claim 1, wherein said semiconductor device (DUT) is fixtured such that ATE connections to the device are made within a scanning chamber of the laser scanning microscope (LSM).

3. A system according to claim 1, further comprising:
    image converting means for representing output from the laser scanning microscope (LSM) as a viewable video signal and for overlaying the output signal indication from the automated test apparatus (ATE) on said viewable video signal; and
    display means for viewing said video signal with overlaid automated test apparatus (ATE) output signal indication.

4. A system according to claim 3, wherein said overlaid ATE output signal indication produces a visible spot on said display means at a location on a simultaneously displayed image of the semiconductor device (DUT) that indicates the location on the semiconductor device (DUT) that was illuminated by the laser scanning microscope (LSM) at the time the automated test apparatus (ATE) output signal indication was produced.

5. A system according to claim 1, wherein said predefined stimulus is provided to said automated test apparatus (ATE) in the form of a set of test vectors.

6. A system according to claim 1, wherein said predefined expected responses are provided to said automated test apparatus (ATE) in the form of a set of test vectors.

7. A system according to claim 1, wherein said automated test apparatus (ATE) is configured to repeatedly apply said predefined stimulus to said semiconductor device (DUT) in a test "loop."

8. A system according to claim 1, wherein said output pulse is a short pulse generated when a difference is detected between responses by said semiconductor device (DUT) to said predefined stimulus and the predefined expected responses.

9. A method for critical parameter analysis (CPA) of a semiconductor device (DUT), comprising:
   providing a focused optical beam scanning device;
   providing automated test apparatus (ATE) for providing predefined stimulus to the semiconductor device (DUT), for comparing responses from the semiconductor device (DUT) against a set of predefined expected responses, and for generating a short output pulse when a difference is detected between responses from said semiconductor device (DUT) and said predefined expected responses, said automated test apparatus being connected to the DUT while the DUT is disposed within a scanning chamber of said laser scanning microscope (LSM);
   displaying an image of said semiconductor device produced by said laser scanning microscope (LSM);
   overlaying a visible representation of said short output pulse on said displayed image to indicate a corresponding position on the semiconductor device (DUT) of a scanning beam of the laser scanning microscope (LSM) at the time the output pulse was generated; and
   simultaneously scanning said semiconductor device (DUT) with said laser scanning microscope (LSM) while repeatedly applying said redefined stimulus to said DUT and comparing responses therefrom against said predefined expected responses using said ATE;
   wherein
      the automated test apparatus (ATE) and the semiconductor device (DUT) form a closed loop feedback system;
      the automated test apparatus (ATE) is programmed to 'break' in or out of a vector loop which is detecting pass/fail operation of the semiconductor device (DU); and
      said automated test apparatus (ATE) is configured to repeatedly cycle ("short-cycle") said predefined stimulus from a starting point up to a point of failure when such failure is detected.

10. A method according to claim 9, wherein said focused optical beam scanning device is a laser scanning microscope (LSM).

11. A method according to claim 9, wherein the automated test apparatus (ATE) is synchronized with the focused optical beam scanning device.

12. A method according to claim 9, further comprising providing optical signatures that only appear on the gate level devices responsible for the failing test.

13. A method according to claim 9, further comprising providing real time feedback to the focused optical beam scanning device and subsequent optical images acquired.

14. A method according to claim 9, further comprising:
   fixturing said semiconductor device (DUT) such that ATE connections to the device are made within a scanning chamber of the focused optical beam scanning device.

15. A method according to claim 9, further comprising:
   representing an output from the focused optical beam scanning device as a viewable video signal and for overlaying the output signal indication from the automated test apparatus (ATE) on said viewable video signal; and
   viewing said video signal with overlaid automated test apparatus (ATE) output signal indication.

16. A method according to claim 15, wherein said overlaid ATE output signal indication produces a visible spot on said display means at a location on a simultaneously displayed image of the semiconductor device (DUT) that indicates the location on the semiconductor device (DUT) that was illuminated by the focused optical beam scanning device at the time the automated test apparatus (ATE) output signal indication was produced.

17. A method according to claim 9, wherein said predefined stimulus is provided to said automated test apparatus (ATE) in the form of a set of test vectors.

18. A method according to claim 9, wherein said predefined expected responses are provided to said automated test apparatus (ATE) in the form of a set of test vectors.

19. A method according to claim 9, wherein said automated test apparatus (ATE) is configured to repeatedly apply said predefined stimulus to said semiconductor device (DUT) in a test "loop."

20. A method according to claim 9, wherein said output pulse is a short pulse generated when a difference is detected between responses by said semiconductor device (DUT) to said predefined stimulus and the predefined expected responses.

* * * * *